US011488863B2

(12) United States Patent
Briggs et al.

(10) Patent No.: US 11,488,863 B2
(45) Date of Patent: Nov. 1, 2022

(54) SELF-ALIGNED CONTACT SCHEME FOR PILLAR-BASED MEMORY ELEMENTS

(71) Applicant: International Business Machines Corporation, Armonk, NY (US)

(72) Inventors: Benjamin D. Briggs, Waterford, NY (US); Nicholas Anthony Lanzillo, Troy, NY (US); Michael Rizzolo, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 16/511,179

(22) Filed: Jul. 15, 2019

(65) Prior Publication Data

US 2021/0020508 A1 Jan. 21, 2021

(51) Int. Cl.
| | |
|---|---|
| *H01L 21/768* | (2006.01) |
| *H01L 27/22* | (2006.01) |
| *H01L 43/02* | (2006.01) |
| *H01L 45/00* | (2006.01) |
| *H01L 27/24* | (2006.01) |
| *H01L 43/12* | (2006.01) |

(52) U.S. Cl.
CPC ...... *H01L 21/76897* (2013.01); *H01L 27/222* (2013.01); *H01L 27/2463* (2013.01); *H01L 43/02* (2013.01); *H01L 43/12* (2013.01); *H01L 45/1233* (2013.01); *H01L 45/16* (2013.01)

(58) Field of Classification Search
CPC . H01L 21/76897; H01L 27/222; H01L 43/02; H01L 45/16; H01L 27/2463; H01L 45/1233; H01L 43/12
See application file for complete search history.

(56) References Cited

U.S. PATENT DOCUMENTS

| | | | |
|---|---|---|---|
| 6,692,898 | B2 | 2/2004 | Ning |
| 6,812,040 | B2 | 11/2004 | Kyler et al. |
| 8,164,128 | B2 | 4/2012 | Kanakasabapathy et al. |
| 9,219,007 | B2 | 12/2015 | Chen et al. |
| 9,324,650 | B2 | 4/2016 | Edelstein et al. |

(Continued)

OTHER PUBLICATIONS

B.D. Briggs et al., "Fully Aligned Via Integration for Extendibility of Interconnects to Beyond the 7 nm Node," IEEE International Election Devices Meeting (IEDM), Dec. 2-6, 2017, 4 pages.

(Continued)

*Primary Examiner* — Ermias T Woldegeorgis
(74) *Attorney, Agent, or Firm* — Daniel Yeates; Ryan, Mason & Lewis, LLP

(57) ABSTRACT

A method for manufacturing a semiconductor device includes forming a plurality of memory elements on a first interconnect level, and forming an etch stop layer on the plurality of memory elements. A dielectric layer is formed on the etch stop layer, and a portion of the dielectric over the plurality of memory elements is removed to expose a portion of the etch stop layer. The method further includes removing the exposed portion of the etch stop layer. The removing of the portion of the dielectric layer and of the exposed portion of the etch stop layer forms a trench. A metallization layer is formed in the trench on the plurality of memory elements, wherein the metallization layer is part of a second interconnect level.

20 Claims, 7 Drawing Sheets

(56) References Cited

U.S. PATENT DOCUMENTS

| | | |
|---|---|---|
| 9,613,861 B2 | 4/2017 | Anderson et al. |
| 2004/0081841 A1* | 4/2004 | Nakajima ............... B82Y 10/00 257/E27.005 |
| 2007/0172964 A1 | 7/2007 | Yen et al. |
| 2008/0096290 A1 | 4/2008 | Smith et al. |
| 2011/0089507 A1* | 4/2011 | Mao ...................... H01L 27/222 257/421 |
| 2014/0070162 A1* | 3/2014 | Iwayama ............ G11C 11/1659 257/4 |
| 2016/0163971 A1* | 6/2016 | Jeong .................... G11C 11/161 438/3 |
| 2017/0025598 A1* | 1/2017 | Kim ........................ H01L 43/08 |
| 2018/0040510 A1 | 2/2018 | Briggs et al. |

OTHER PUBLICATIONS

Disclosed Anonymously, "Bi-Directionally Self Aligned Vias," IP.Com No. IPCOM000231097D, Sep. 26, 2013, 6 pages.

* cited by examiner

100

100

100

SELF-ALIGNED CONTACT SCHEME FOR PILLAR-BASED MEMORY ELEMENTS

BACKGROUND

Certain integration schemes require memory elements in the back-end-of-line (BEOL) or middle-of-line (MOL) to span vertical distances and be formed in a column or pillar shape. For example, such memory elements are included in phase-change random-access memory (PCRAM), resistive random-access memory (RRAM or ReRAM) and magnetic random-access memory (MRAM) devices such as magnetic tunnel junction (MTJ) devices.

Contacting the top of pillar-based memory elements is challenging due to across wafer non-uniformity in dielectric deposition and dielectric reactive ion etching (ME). For tight-pitch applications, two-dimensional (2D) alignment of top contact lines or vias is critical to prevent missing or incomplete electrical contacts to pillar-based memory elements.

SUMMARY

According to an exemplary embodiment of the present invention, a method for manufacturing a semiconductor device includes forming a plurality of memory elements on a first interconnect level, and forming an etch stop layer on the plurality of memory elements. A dielectric layer is formed on the etch stop layer, and a portion of the dielectric over the plurality of memory elements is removed to expose a portion of the etch stop layer. The method further includes removing the exposed portion of the etch stop layer. The removing of the portion of the dielectric layer and of the exposed portion of the etch stop layer forms a trench. A metallization layer is formed in the trench on the plurality of memory elements, wherein the metallization layer is part of a second interconnect level.

According to an exemplary embodiment of the present invention, a semiconductor device includes a plurality of memory elements disposed on a first interconnect level, wherein the plurality of memory elements are spaced apart from each other. A first dielectric layer is disposed adjacent to and in spaces between the plurality of memory elements, and a metallization layer is disposed on the plurality of memory elements and on the first dielectric layer. The metallization layer is formed in a trench and is part of a second interconnect level. The trench is formed in a second dielectric layer including a different material than the first dielectric layer. Bottom surfaces of the metallization layer on the plurality of memory elements are level or substantially level with each other.

According to an exemplary embodiment of the present invention, a method for manufacturing a semiconductor device includes forming a plurality of memory elements on a first interconnect level, wherein the plurality of memory elements are spaced apart from each other. In the method, a first dielectric layer is formed adjacent to and in spaces between the plurality of memory elements. An etch stop layer is formed on the first dielectric layer and on the plurality of memory elements. The method further includes forming a second dielectric layer including a different material than the first dielectric layer on the etch stop layer, and etching a portion of the second dielectric layer down to the etch stop layer. An exposed portion of the etch stop layer is removed following the etching of the portion of the second dielectric layer, and a metallization layer is formed on the plurality of memory elements and on the first dielectric layer. The metallization layer is part of a second interconnect level.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
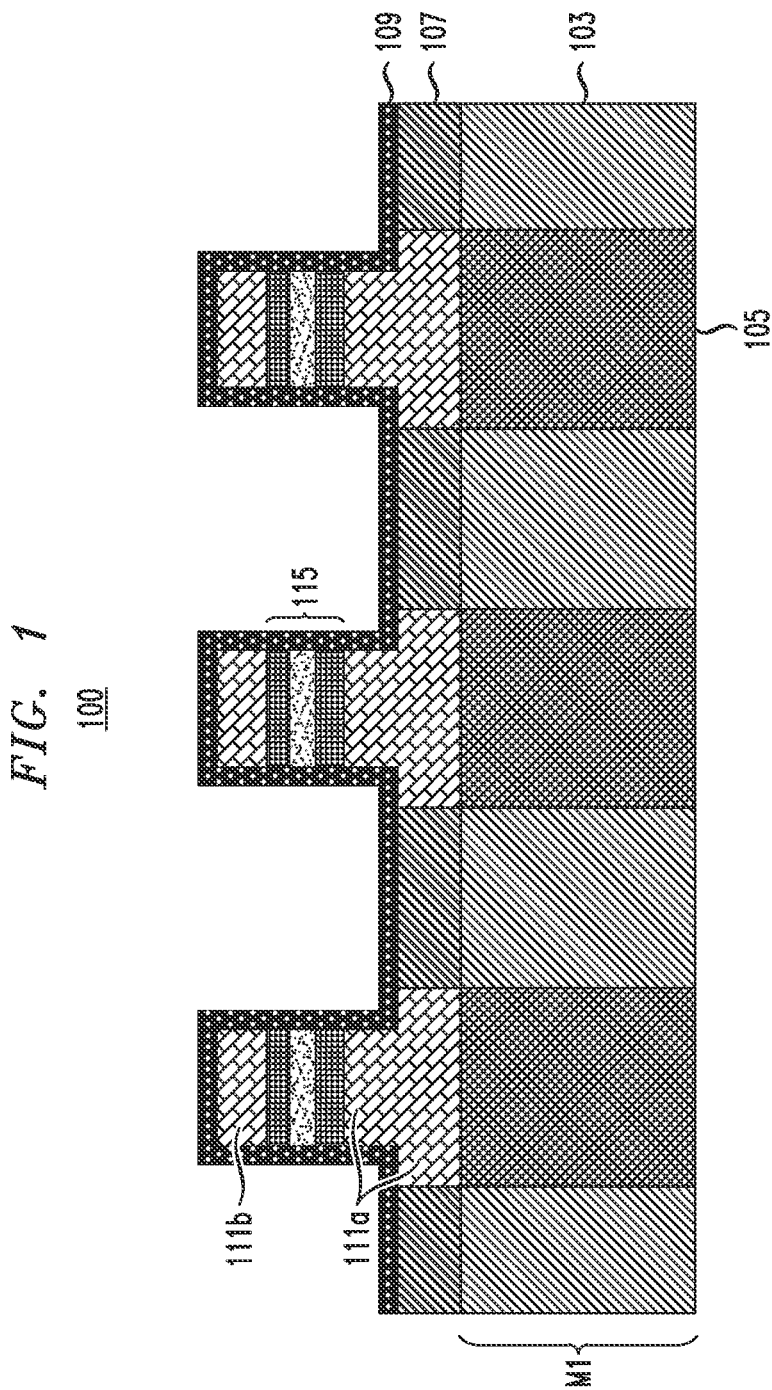
FIG. 1 is a cross-sectional view illustrating fabrication of a semiconductor device at a back-end-of-line (BEOL) or middle-of-line (MOL), and showing encapsulation of memory elements, according to an exemplary embodiment of the present invention.

Exemplary embodiments of the invention will now be discussed in further detail with regard to semiconductor devices and methods of manufacturing same and, in particular, to interconnect trenches which are etched to be self-aligned with underlying memory element structures.

It is to be understood that the various layers and/or regions shown in the accompanying drawings are not drawn to scale, and that one or more layers and/or regions of a type commonly used in, for example, phase-change memory (PCM), phase-change random-access memory (PCRAM), resistive random-access memory (RRAM or ReRAM), three-dimensional (3D) RRAM, magnetic random-access memory (MRAM), magnetic tunnel junction (MTJ), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, PCMs, PCRAMs, RRAM/ReRAMs, 3D RRAMs, MRAMs, MTJs, fuse/anti-fuses, diodes, OTSs, BJTs, CMOSs, FETs, nanowire FETs, nanosheet FETs, FinFETs and/or MOSFETs. By way of non-limiting example, the semiconductor devices can include, but are not necessarily limited to PCM, PCRAM, RRAM/ReRAM, 3D RRAM, MRAM, MTJ, fuse/anti-fuse, diode, OTS, BJT, CMOS, FET, nanowire FET, nanosheet FET, FinFET, MOSFET devices, and/or semiconductor devices that use PCM, PCRAM, RRAM/ReRAM, 3D RRAM, MRAM, MTJ, fuse/anti-fuse, diode, OTS, BJT, CMOS, FET, nanowire FET, nanosheet FET, FinFET and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

There is a need for methods and structures which prevent non-uniform dielectric deposition and etching when forming BEOL or MOL contacts to pillar-based memory elements.

In accordance with one or more embodiments, an etch stop layer is formed to be coincident with the top of a plurality of memory elements to prevent dielectric over-etching and enable uniform dielectric height across wafer. Increases in capacitance that may be caused by a high-k dielectric etch stop layer are not an issue with the memory devices of the embodiments.

The embodiments permit self-alignment, putting less emphasis on tightening alignment, and allow for the use of a different dielectric for the contact (e.g., metallization) level than that used for the memory element level.

According to an embodiment, an interconnect trench can be etched to land directly on an underlying memory element structure (e.g., MTJ structure) through the use of an etch stop layer. As a result, there is reduced variability in processing since differently timed etches to remove different amounts of non-uniformly deposited dielectric material are not required. Due to the etch stop layer, trenches having bottom surfaces level to each other (e.g., at the same depth) are formed regardless of whether the dielectric layer has different starting heights due to non-uniform dielectric layer deposition and/or whether etching of the dielectric layer is non-uniform.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

Referring to FIG. 1, a semiconductor device 100 includes a plurality of interconnects 105 formed in a dielectric layer 103. The interconnects 105 may include, for example, conductive vias or contacts electrically connecting to one or more contact lines (e.g., wordlines) of a resulting memory cell array. The interconnects 105 and the dielectric layer 103 form at least part of a first interconnect level M1.

The dielectric layer 103 includes, for example, silicon dioxide ($SiO_2$), carbon-doped silicon oxide (SiCOH), SiLK® dielectrics, porous forms of these low-k dielectric films, flowable dielectrics and/or spin-on dielectrics. As can be understood by one of ordinary skill in the art, the dielectric layer 103 can be on a semiconductor substrate (not shown), with intervening layers (e.g., lower conductive lines, devices, etc.) between the dielectric layer 103 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

The interconnects 105 include, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof.

A dielectric cap layer 107 comprising, for example, NBLoK™ material or a nitride material (e.g., silicon nitride (SiN)), is formed on the dielectric layer 103. NBLoK™ material is from Applied Materials, Inc. of Santa Clara, Calif., and is a nitrogen-doped silicon carbide. In an alternative embodiment, the cap layer 107 can be omitted.

Bottom contact layers 111a (e.g., bottom electrodes) for memory elements 115, such as, for example, MRAM or other non-volatile memory devices, are formed in the dielectric cap layer 107 to contact the interconnects 105. The bottom contact layers 111a include, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof deposited using deposition techniques, including, but not necessarily limited to, physical vapor deposition (PVD), chemical vapor deposition (CVD), atomic layer deposition (ALD) or sputtering. In accordance with an embodiment of the present invention, the bottom contact layers 111a can be electrically connected to or form part of a contact line, such as, for example, a wordline, of a resulting memory cell array. For ease of explanation, three memory elements 115 and corresponding interconnects 105 are shown in the figures. It is to be understood that this is merely illustrative, and the embodiments of the present invention are not necessarily limited to the number of interconnects or memory elements shown, and the embodiments of the present invention can apply to the formation of more or less interconnects and/or memory elements.

Referring further to FIG. 1, memory elements 115 (also referred to herein as "memory devices") are formed on the bottom contact layers 111a. For example, in the case of an MRAM, the memory elements 115 include a magnetic tunnel junction (MTJ) structure comprising, for example, one or more magnetic fixed layers, non-magnetic barrier layers, free layers and oxide layers. The memory elements 115 are not limited to those for an MRAM, and can include layers for memory elements of, for example, PCRAM, RRAM or other non-volatile memory devices. The memory elements 115 may include a cap layer, for example, an MTJ cap layer including, but not necessarily limited to, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc) and/or other conductive materials.

Top contact layers 111b comprising the same or similar materials as the bottom contact layers 111a are formed on top of the memory elements 115. As can be seen in FIG. 1, each memory element 115 and top contact layer 111b and a part of each bottom contact layer 111a are patterned into a pillar structure.

An encapsulation layer 109 is conformally deposited on and around the pillar structures and on the portions of the bottom contact layers 111a and the cap layer 107 adjacent the pillar structures. The encapsulation layer 109 is deposited using deposition techniques such as, but not necessarily limited to, ALD or CVD. The encapsulation layer 109 includes a dielectric material, such as, but not necessarily limited to, SiN.

Figure 2:
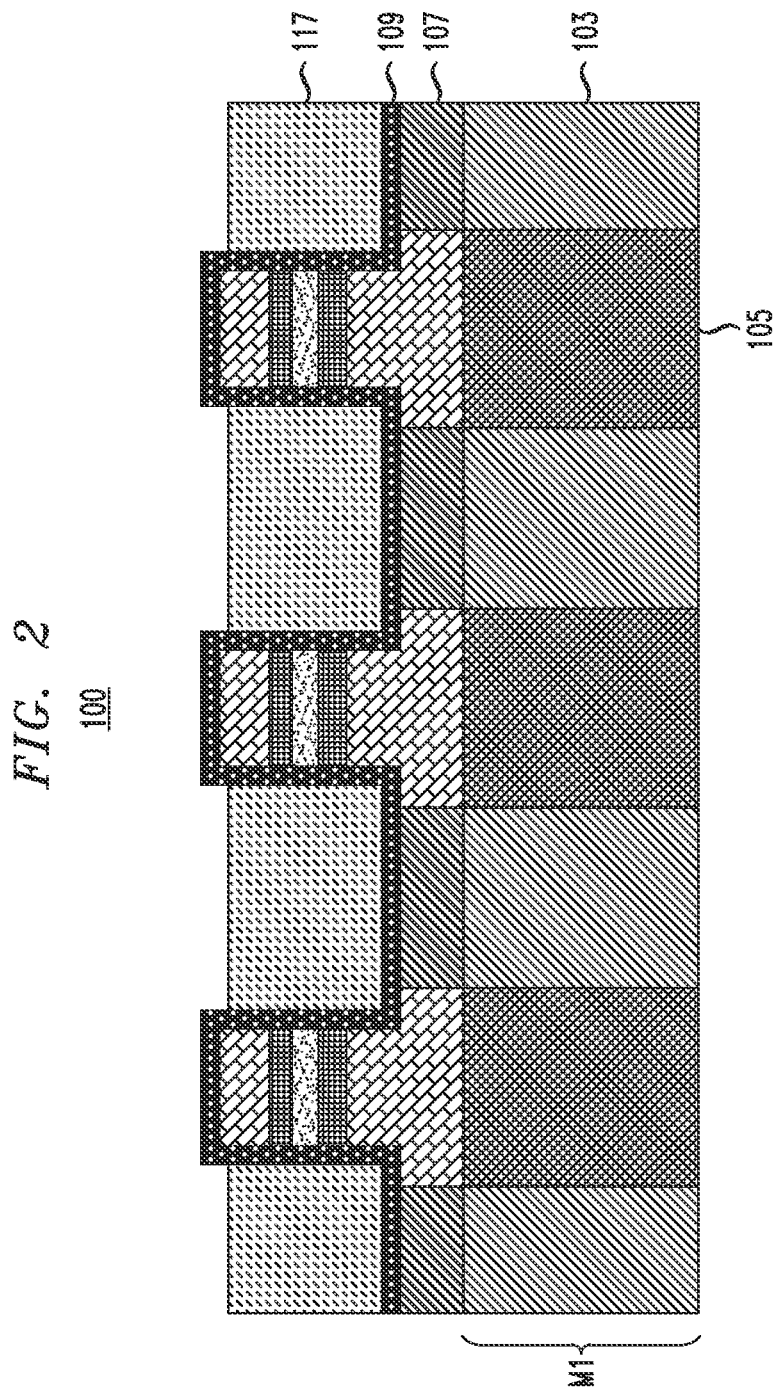
FIG. 2 is a cross-sectional view illustrating fabrication of a semiconductor device at a BEOL or MOL, and showing flowable dielectric deposition, according to an exemplary embodiment of the present invention.

Referring to FIG. 2, a flowable dielectric layer 117 is deposited on the encapsulation layer 109 in the spaces adjacent and/or between the pillar structures. According to an embodiment, the spaces are filled with the flowable dielectric layer 117 to a vertical height which is near (e.g., just below) the top surface of the top contact layer 111b. Alternatively, the flowable dielectric layer 117 is filled to a vertical height greater than that of the top surface of the top contact layer 111b, and a planarization process, such as, for example, chemical mechanical polishing (CMP), is performed to remove excess flowable dielectric layer 117 over the pillars. The planarization process is stopped to cause the top surface of the flowable dielectric layer 117 to be level or substantially level with the top surface of the encapsulation layer 109 on the top surface of the contact layers 111b. According to one or more embodiments, the flowable dielectric layer 117 is deposited using a deposition technique, such as, but not necessarily limited to, PVD, CVD, ALD, plasma enhanced CVD (PECVD), radio-frequency CVD (RFCVD), molecular layer deposition (MLD), molecular beam deposition (MBD), pulsed laser deposition (PLD), liquid source misted chemical deposition (LSMCD), and/or sputtering. The flowable dielectric layer 117 includes a low-k flowable dielectric material, such as, but not necessarily limited to, the same or similar materials as those listed for dielectric layer 103.

Figure 3:
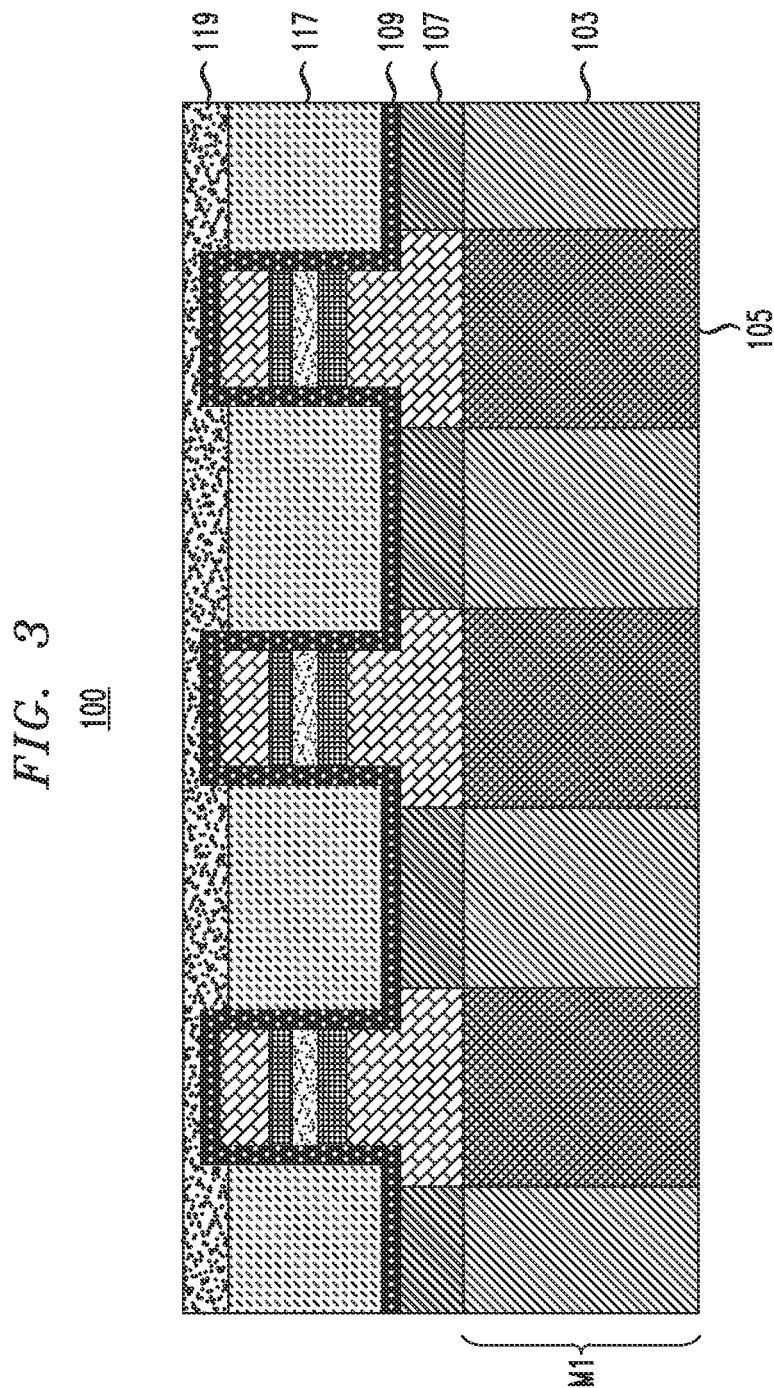
FIG. 3 is a cross-sectional view illustrating fabrication of a semiconductor device at a BEOL or MOL, and showing deposition of an etch stop layer, according to an exemplary embodiment of the present invention.

Referring to FIG. 3, an etch-stop layer 119 is deposited on the flowable dielectric layer 117 and on exposed portions of the encapsulation layer 109 in the spaces adjacent and/or between the pillar structures, and on top surfaces of the encapsulation layer 109 on top of the pillar structures. According to an embodiment, the etch stop layer 119 is deposited to a vertical height (thickness) which is above the top surface of the encapsulation layer 109. For example, a thickness of the etch stop layer 119 may be in the range of about 2 nm to about 10 nm. The etch stop layer 119 includes for example, aluminum oxide ($Al_2O_3$), hafnium oxide ($HFO_x$), tetraethyl orthosilicate (TEOS), SiN, NBLoK™ material or other appropriate etch stop material. The etch stop layer 119 is deposited using deposition techniques such as, but not necessarily limited to, ALD, CVD or PVD.

Figure 4:
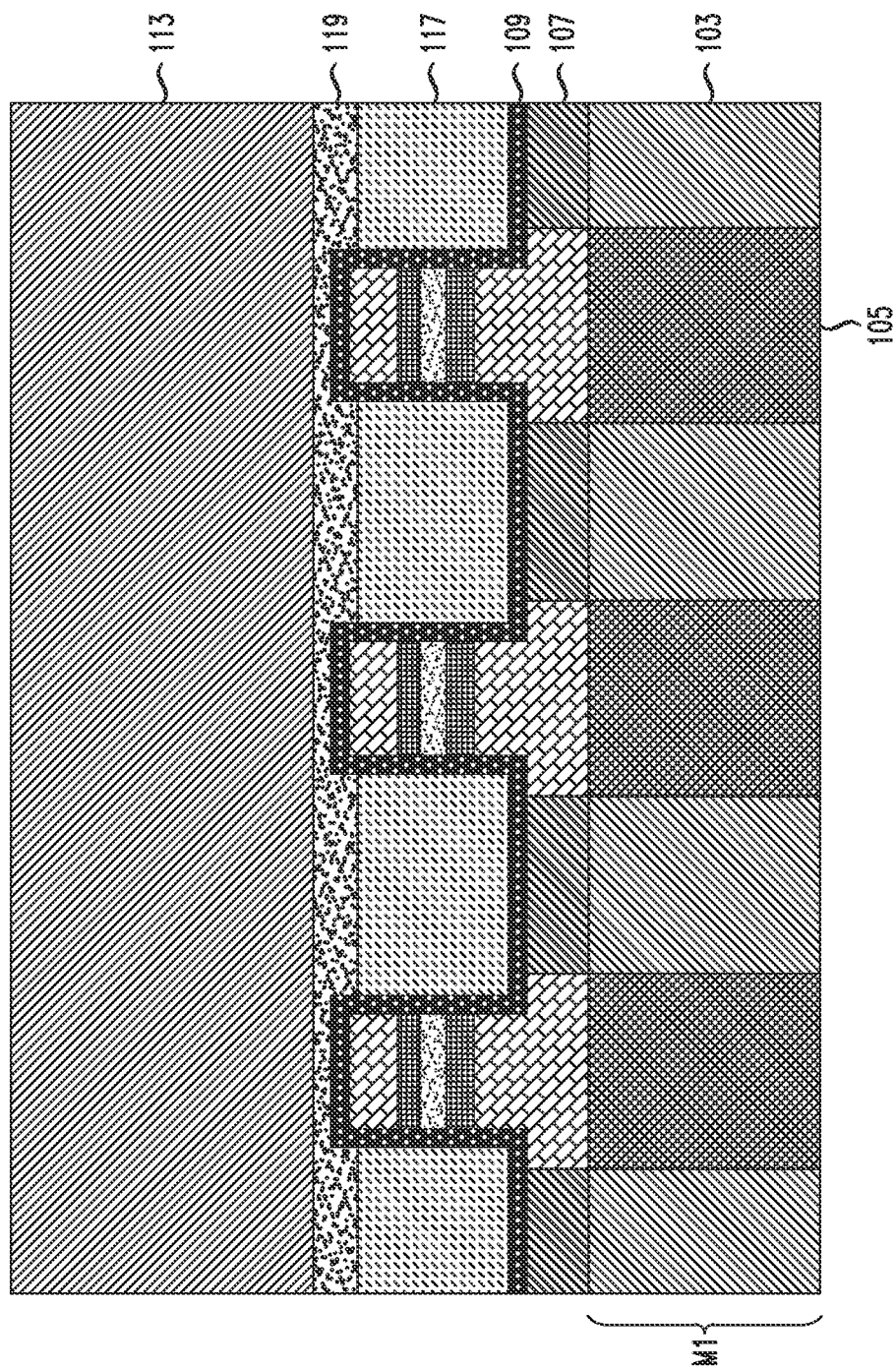
FIG. 4 is a cross-sectional view illustrating fabrication of a semiconductor device at a BEOL or MOL, and showing metallization level dielectric layer deposition, according to an exemplary embodiment of the present invention.

Referring to FIG. 4, a dielectric layer 113 is deposited on the etch stop layer 119. According to an embodiment, the dielectric layer 113 comprises the same or similar material as that of the dielectric layer 103, as long as the dielectric layer is able to be selectively etched with respect to the etch stop layer 119. According to an embodiment, the dielectric layer 113 also comprises a different material from the material of flowable dielectric layer 117. For example, the dielectric layer 113 does not comprise a flowable material. The dielectric layer 113 is deposited using, for example, PVD, CVD, ALD, PECVD, RFCVD, MLD, MBD, PLD, LSMCD, and/or sputtering. The dielectric layer 113 shown in FIG. 4 as having a uniform or substantially uniform height with respect to the underlying etch stop layer 119. Alternatively, the dielectric layer 113 may have a non-uniform height with respect to the underlying etch stop layer 119. In either case (uniform or non-uniform height), the presence of the underlying etch stop layer 119 permits complete removal of the dielectric layer 113 down to the etch stop layer 119, which permits formation of a trench in the dielectric layer 113 having a uniform (e.g., level) bottom surface or trenches in the dielectric layer 113 each having bottom surfaces level with each other.

Figure 5:
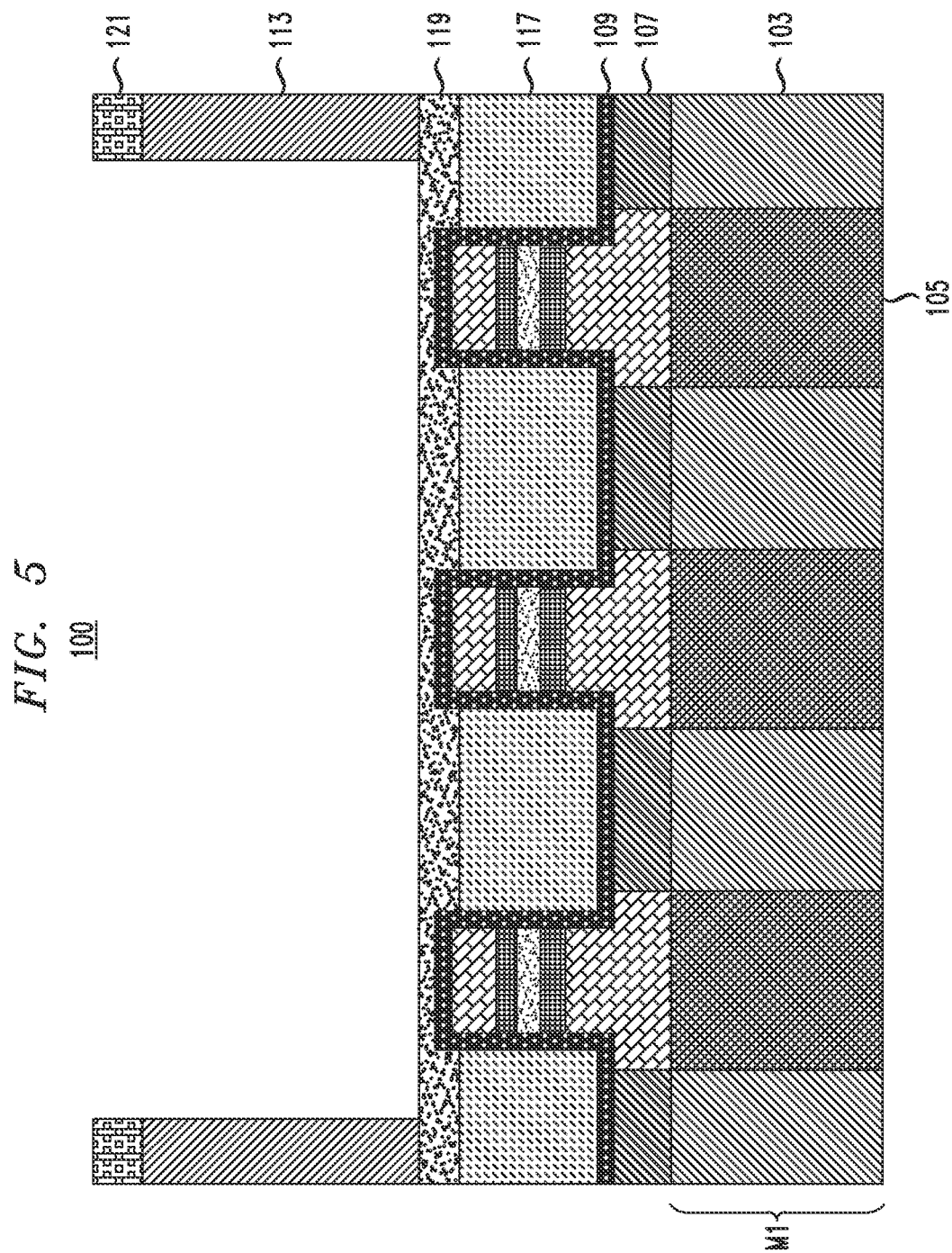
FIG. 5 is a cross-sectional view illustrating fabrication of a semiconductor device at a BEOL or MOL, and showing removal of portions of a metallization level dielectric layer, according to an exemplary embodiment of the present invention.

For example, referring to FIG. 5, an exposed portion of the dielectric layer 113 not covered by mask portions 121 are etched down to the etch stop layer 119. Since the etch stop layer 119 is not etched by the etchant used to remove the dielectric layer 113 or, at the very least, is etched at a very slow rate with respect to that of the dielectric layer 113, the exposed portion of the dielectric layer 113 can be completely removed. For example, a representative selectivity ratio of the etch rate of the dielectric layer 113 with respect to that of the etch stop layer 119 would be approximately 5:1. Due to the etch stop layer 119, as shown in FIG. 5, a trench having a level bottom surface (e.g., uniform depth) is formed regardless of whether the dielectric layer 113 had different starting heights due to non-uniform dielectric layer deposition and/or whether etching of the dielectric layer 113 was non-uniform. According to an embodiment, the etching is performed using, for example, a combination of plasma treatment and nitrogen-based ($NH_3$) chemical exposure, which could include $N_2/O_2$, $N_2/H_2$, etc. The mask 121 is a hardmask comprising, for example, a nitride such as SiN, silicon boron nitride (SiBN) or silicon boron carbon nitride (SiBCN), or other material.

Figure 6:
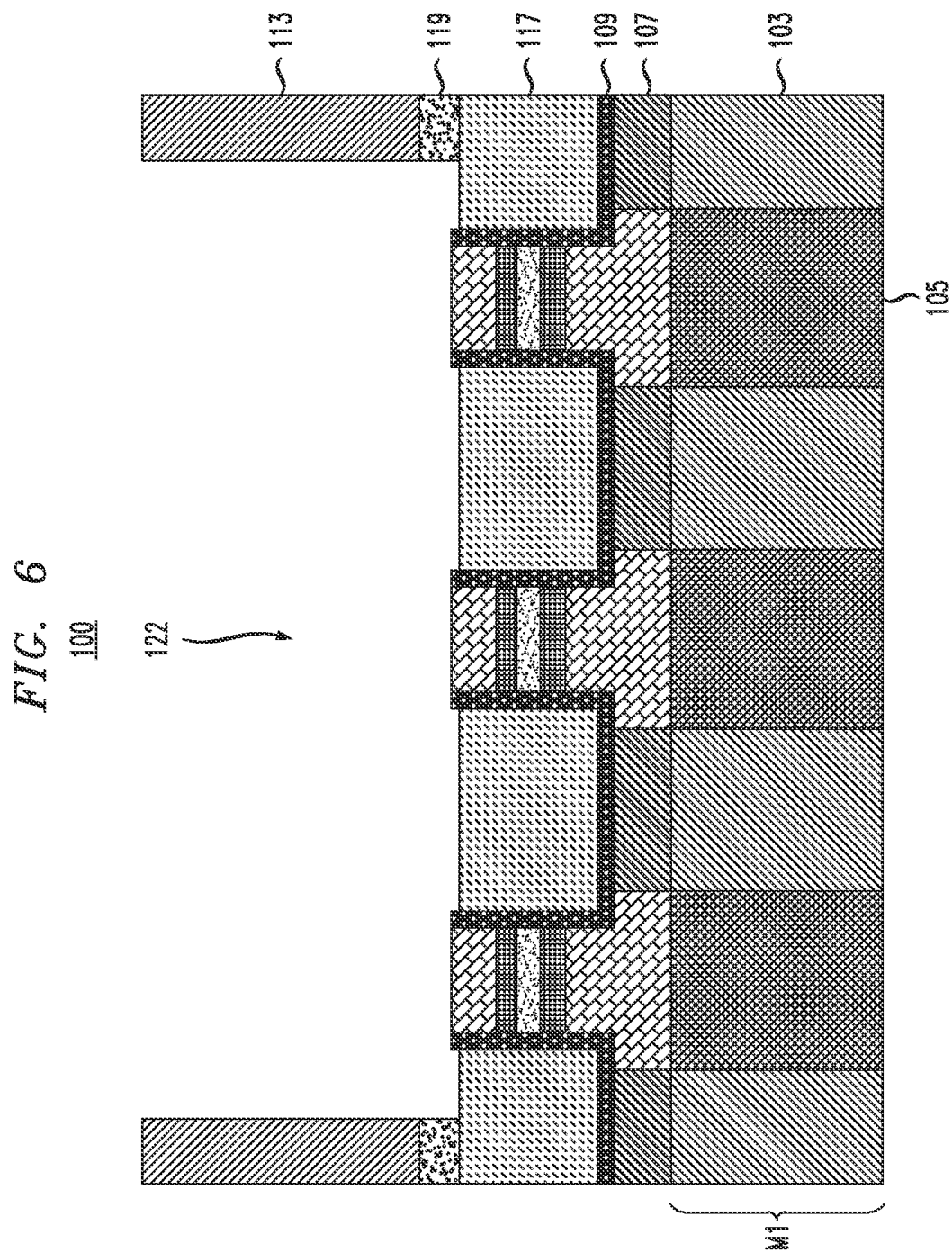
FIG. 6 is a cross-sectional view illustrating fabrication of a semiconductor device at a BEOL or MOL, and showing removal of hardmask and etch stop layers, and portions of an encapsulation layer, according to an exemplary embodiment of the present invention.

Referring to FIG. 6, the mask 121 and the etch stop layer 119 are selectively removed using, for example, a wet etch process comprising, for example, hydrogen peroxide ($H_2O_2$) or some other hydrogen source to etch both the mask 121 and the etch stop layer 119. According to an example, embodiment, the etch stop layer 119 can be aluminum nitride or aluminum oxide, while the material of the mask 121 can be TiN or SiN, which can both be removed by hydrogen peroxide. Following removal of the mask 121 and the etch stop layer 119, upper portions of the encapsulation layer 109 on the top surfaces of the contact layers 111b of the pillars on which the etch stop layer 119 was formed are removed using, for example, a ME process comprising a hydrogen-based etch chemistry, similar to the etch chemistry used for removing the mask and etch stop layers 121 and 119. The removal of the upper portions of the encapsulation layer 109 exposes the top surfaces of the contact layers 111b.

Figure 7:
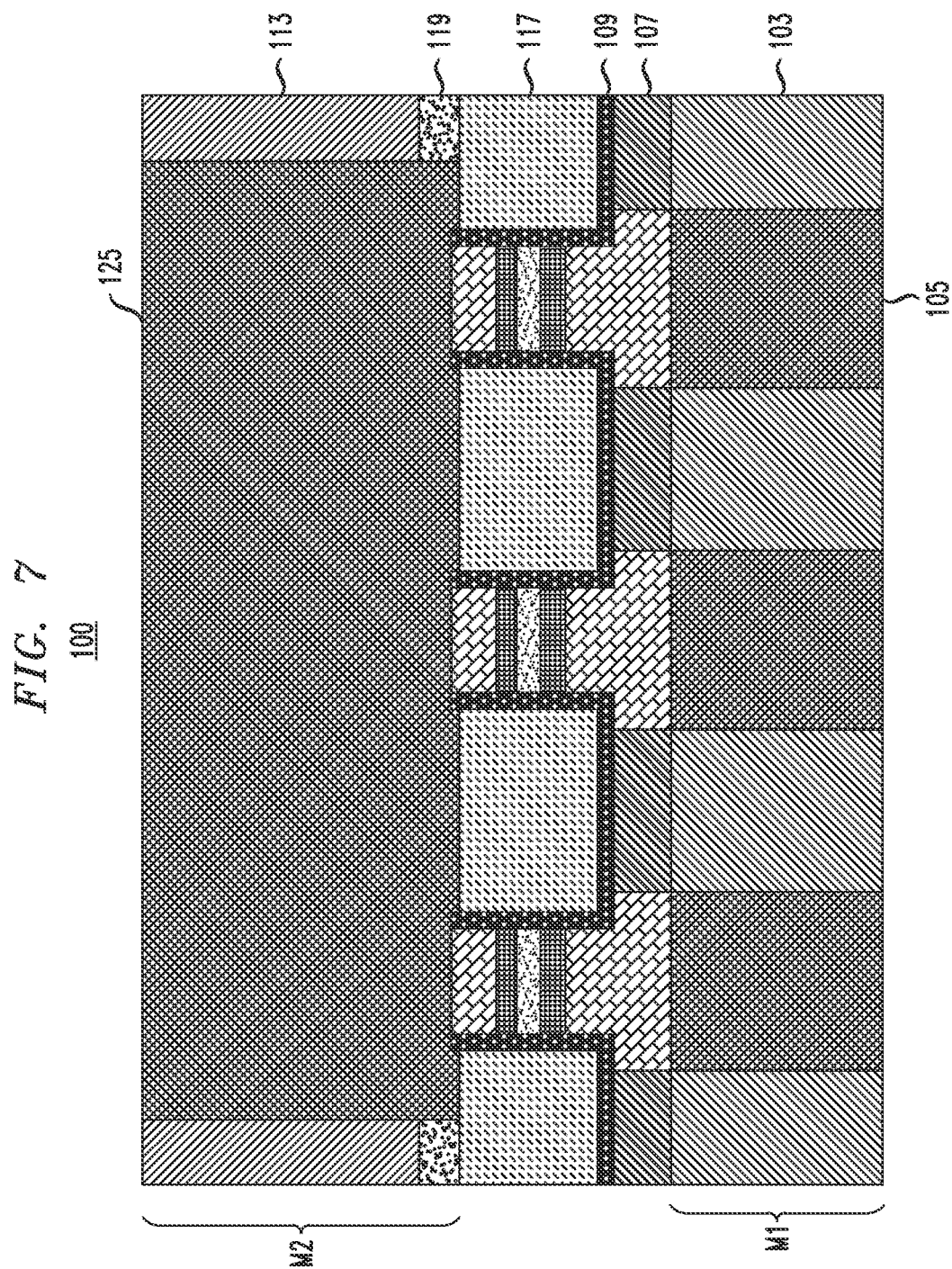
FIG. 7 is a cross-sectional view illustrating fabrication of a semiconductor device at a BEOL or MOL, and showing metal deposition, according to an exemplary embodiment of the present invention.

Referring to FIG. 7, a metallization layer 125 (e.g., interconnect) is deposited in the opening (e.g., trench) 122 left by the removal of the etch stop layer 119 and the portions of the encapsulation layer 109. The metallization layer 125 contacts the exposed top surfaces of the contact layers 111b. As can be seen the metallization layer 125 is uniformly disposed on the top surfaces of the contact layers 111b, which are level or substantially level with each other, such that the portions of the metallization layer 125 contacting the top surfaces of the contact layers 111b are level or substantially level with each other. In addition, portions of the metallization layer are disposed on the flowable dielectric layer 117, which, according to an embodiment, is at a lower height than the top surfaces of the contact layers 111b. The metallization layer 125, the dielectric layer 113 and the remaining portions of the etch stop layer 119 form at least part of a second interconnect level M2.

The metallization layer 125 includes, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof, and is deposited using, for example, PVD, CVD, ALD, PECVD, RFCVD, MLD, MBD, PLD, LSMCD, and/or sputtering. The deposition of the metallization layer may be followed by a planarization process, such as, for example, CMP. According to an embodiment, a liner/barrier layer (not shown) is conformally formed on sidewalls and bottom surfaces of the opening 122 in which the metallization layer 125 is formed, and the metallization layer 125 is formed on the liner/barrier layer. The liner/barrier layer includes, for example, titanium nitride, tantalum nitride or tungsten nitride.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a plurality of memory elements on a first interconnect level, wherein the plurality of memory elements are spaced apart from each other;
    forming a contact layer on top of respective ones of the plurality of memory elements;
    forming a first dielectric layer adjacent to and in spaces between the plurality of memory elements;
    forming an etch stop layer on the first dielectric layer, on the plurality of memory elements and on each of the contact layers;
    forming a second dielectric layer on the etch stop layer;
    removing a portion of the second dielectric over the plurality of memory elements to expose a portion of the etch stop layer;
    removing the exposed portion of the etch stop layer, wherein the removing of the portion of the second dielectric layer and of the exposed portion of the etch stop layer forms a trench; and
    forming a metallization layer in the trench on the plurality of memory elements, on each of the contact layers and on the first dielectric layer, wherein the metallization layer is part of a second interconnect level;
    wherein the metallization layer extends over each of the contact layers and the respective ones of the plurality of memory elements;
    wherein portions of the metallization layer are formed on top and on sides of each of the contact layers;
    wherein lowermost portions of the metallization layer are formed on the sides of each of the contact layers and on top of an uppermost surface of the first dielectric layer; and
    wherein the uppermost surface of the first dielectric layer is at a height between a top surface and a bottom surface of each of the contact layers.

2. The method according to claim 1, wherein the etch stop layer is formed on the first dielectric layer.

3. The method according to claim 2, wherein the first dielectric layer comprises a different material from the second dielectric layer formed on the etch stop layer.

4. The method according to claim 3, wherein the first dielectric layer comprises a flowable dielectric.

5. The method according to claim 1, wherein the portions of the metallization layer formed on top of each of the contact layers contact each of the contact layers.

6. The method according to claim 5, wherein the portions of the metallization layer contacting the contact layers are level or substantially level with each other.

7. The method according to claim 1, further comprising forming an encapsulation layer on the plurality of memory elements, wherein the etch stop layer is formed on top of an upper portion of the encapsulation layer.

8. The method according to claim 7, further comprising removing the upper portion of the encapsulation layer following the removing of the exposed portion of the etch stop layer.

9. The method according to claim 1, wherein the etch stop layer comprises one of aluminum oxide ($Al_2O_3$), hafnium oxide ($HFO_x$), tetraethyl orthosilicate (TEOS), silicon nitride (SiN) and NBLoK™ material.

10. The method according to claim 1, wherein the trench is self-aligned with the plurality of memory elements.

11. The method according to claim 1, further comprising forming an encapsulation layer on sides of each of the plurality of memory elements, wherein the encapsulation layer is located between the first dielectric layer and each of the plurality of memory elements.

12. A semiconductor device, comprising:
a plurality of memory elements disposed on a first interconnect level, wherein the plurality of memory elements are spaced apart from each other;
a contact layer disposed on top of respective ones of the plurality of memory elements;
a first dielectric layer disposed adjacent to and in spaces between the plurality of memory elements; and
a metallization layer disposed on each of the contact layers, on the plurality of memory elements and on the first dielectric layer, wherein the metallization layer is formed in a trench and is part of a second interconnect level;
wherein the trench is formed in a second dielectric layer comprising a different material than the first dielectric layer;
wherein bottom surfaces of the metallization layer on each of the contact layers on the respective ones of the plurality of memory elements are level or substantially level with each other;
wherein the metallization layer extends over each of the contact layers and the respective ones of the plurality of memory elements;
wherein portions of the metallization layer are formed on sides of each of the contact layers;
wherein lowermost portions of the metallization layer are formed on the sides of each of the contact layers and on top of an uppermost surface of the first dielectric layer; and
wherein the uppermost surface of the first dielectric layer is at a height between a top surface and a bottom surface of each of the contact layers.

13. The semiconductor device according to claim 12, further comprising an etch stop layer formed on a portion of the first dielectric layer outside of the trench.

14. The semiconductor device according to claim 13, wherein the etch stop layer is positioned between the first and second dielectric layers.

15. The semiconductor device according to claim 12, wherein the bottom surfaces of the metallization layer on each of the contact layers on the plurality of memory elements contact each of the contact layers.

16. The semiconductor device according to claim 12, wherein an encapsulation layer is disposed on sides of each of the plurality of memory elements between the first dielectric layer and each of the plurality of memory elements.

17. A method for manufacturing a semiconductor device, comprising:
forming a plurality of memory elements on a first interconnect level, wherein the plurality of memory elements are spaced apart from each other;
forming a contact layer on top of respective ones of the plurality of memory elements;
forming a first dielectric layer adjacent to and in spaces between the plurality of memory elements;
forming an etch stop layer on the first dielectric layer, on each of the contact layers and on the plurality of memory elements;
forming a second dielectric layer comprising a different material than the first dielectric layer on the etch stop layer;
etching a portion of the second dielectric layer down to the etch stop layer;
removing an exposed portion of the etch stop layer following the etching of the portion of the second dielectric layer; and
forming a metallization layer on the plurality of memory elements, on each of the contact layers and on the first dielectric layer, wherein the metallization layer is part of a second interconnect level;
wherein the metallization layer extends over each of the contact layers and the respective ones of the plurality of memory elements;
wherein portions of the metallization layer are formed on top and on sides of each of the contact layers;
wherein lowermost portions of the metallization layer are formed on the sides of each of the contact layers and on top of an uppermost surface of the first dielectric layer; and
wherein the uppermost surface of the first dielectric layer is at a height between a top surface and a bottom surface of each of the contact layers.

18. The method according to claim 17, wherein the metallization layer is formed in a trench in the second dielectric layer which is self-aligned with the plurality of memory elements.

19. The method according to claim 17, wherein the portions of the metallization layer formed on top of each of the contact layers contact each of the contact layers.

20. The method according to claim 17, further comprising forming an encapsulation layer on sides of each of the plurality of memory elements, wherein the encapsulation layer is located between the first dielectric layer and each of the plurality of memory elements.

* * * * *